US009686858B2

(12) United States Patent
Kitajima

(10) Patent No.: US 9,686,858 B2
(45) Date of Patent: Jun. 20, 2017

(54) COMPOSITE MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 183 days.

(21) Appl. No.: 14/551,284

(22) Filed: Nov. 24, 2014

(65) Prior Publication Data

US 2015/0080050 A1 Mar. 19, 2015

Related U.S. Application Data

(63) Continuation of application No. PCT/JP2013/063247, filed on May 13, 2013.

(30) Foreign Application Priority Data

May 28, 2012 (JP) ................................ 2012-120595

(51) Int. Cl.

*H05K 1/03* (2006.01)
*H05K 1/02* (2006.01)
(Continued)

(52) U.S. Cl.

CPC ..... *H05K 1/0298* (2013.01); *H01L 23/49822* (2013.01); *H01L 23/552* (2013.01);
(Continued)

(58) Field of Classification Search

CPC ............. H01L 23/49822; H01L 23/552; H01L 23/642; H05K 1/0253; H05K 1/0298;
(Continued)

(56) References Cited

U.S. PATENT DOCUMENTS 7,436,056 B2 * 10/2008 Cheung .................. H01L 23/10
257/698
2002/0108779 A1 8/2002 Ohsaka
(Continued)

FOREIGN PATENT DOCUMENTS

JP 2002-290058 A 10/2002
JP 2006-033211 A 2/2006
(Continued)

OTHER PUBLICATIONS

Official Communication issued in International Patent Application No. PCT/JP2013/063247, mailed on Jul. 9, 2013.

*Primary Examiner* — Steven T Sawyer
(74) *Attorney, Agent, or Firm* — Keating & Bennett, LLP

(57) ABSTRACT

A composite module includes outer ground electrodes on one main surface of a wiring substrate, a wiring electrode inside the wiring substrate, and a first ground electrode between the wiring electrode and the outer ground electrode. A cutout is provided in the first ground electrode at least at a portion of a region overlapping with the wiring electrode and the outer ground electrode when viewed from above, and the wiring electrode overlaps with at least one of the first ground electrode and the outer ground electrode when viewed from above to reduce stray capacitance produced on the wiring electrode and to adjust impedance of the wiring electrode while preventing signals leaked from the exterior from interfering with the wiring electrode.

13 Claims, 5 Drawing Sheets

(51) Int. Cl.

| | |
|---|---|
| ***H01L 23/498*** | (2006.01) |
| ***H01L 23/552*** | (2006.01) |
| ***H01L 23/64*** | (2006.01) |
| ***H05K 1/16*** | (2006.01) |
| ***H05K 1/18*** | (2006.01) |
| *H01L 23/50* | (2006.01) |
| *H04W 88/06* | (2009.01) |

(52) U.S. Cl.
CPC ......... *H01L 23/642* (2013.01); *H05K 1/0253* (2013.01); *H05K 1/165* (2013.01); *H05K 1/181* (2013.01); *H01L 23/49838* (2013.01); *H01L 23/50* (2013.01); *H01L 2224/16* (2013.01); *H01L 2924/19105* (2013.01); *H04W 88/06* (2013.01); *H05K 1/0225* (2013.01); *H05K 2201/09336* (2013.01); *H05K 2201/10053* (2013.01)

(58) Field of Classification Search
CPC ...... H05K 1/165; H05K 1/181; H05K 1/0218; H05K 1/0224; H05K 1/0225; H05K 1/0227; H05K 2201/093; H05K 2201/0969; H05K 1/025
See application file for complete search history.

(56) References Cited

U.S. PATENT DOCUMENTS

2003/0003862 A1* 1/2003 Yoshida ................. H05K 3/403 455/25
2007/0241447 A1 10/2007 Cheung et al.
2009/0009261 A1* 1/2009 Song ....................... H01P 3/085 333/128
2009/0244869 A1 10/2009 Tsukuda et al.
2009/0315649 A1* 12/2009 Minegishi ................. H01P 1/02 333/238

FOREIGN PATENT DOCUMENTS

JP 2006-278780 A 10/2006
JP 2007-287916 A 11/2007
JP 2009-246317 A 10/2009

* cited by examiner

COMPOSITE MODULE

BACKGROUND OF THE INVENTION

1. Field of the Invention

The present invention relates to composite modules provided with a wiring substrate including wiring electrodes provided inside and on a main surface thereof.

2. Description of the Related Art

With cellular phones becoming smaller in size and thickness, composite modules mounted therein are being required to be reduced in size and lowered in profile these days. As such, wiring substrates included in composite modules are made smaller in size and thickness, and various types of circuits are configured such that wiring electrodes, ground electrodes, and so on that constitute inductors, capacitors, and the like are so disposed as to be close to one another on each wiring substrate, whereby reduction in size and lowering in profile of the composite modules are realized. However, when the electrodes are disposed close to one another as described above, undesired stray capacitance and the like are produced between the wiring electrodes and the ground electrodes constituting inductor elements, for example. This causes a problem that frequency characteristics of the inductor elements are deteriorated and characteristic impedance of the wiring electrodes defined between the wiring electrodes and the ground electrodes cannot have a predetermined value.

As a known technique, as shown in FIG. 5, a high frequency module 200 is proposed in which a cutout 204 is provided in a ground electrode 202, which is formed inside a wiring substrate 201, at a portion thereof overlapping with an inductor element 203 when viewed from above (see, for example, paragraphs [0059] to [0063] and FIG. 7 of Japanese Unexamined Patent Application Publication No. 2006-33211). This technique makes it possible to reduce stray capacitance produced between the ground electrode 202 and the inductor element 203 so that the frequency characteristics of the inductor element 203 can be prevented from being deteriorated.

Note that, however, in the case where the cutout 204 is provided in the ground electrode 202 in the manner as seen in the known technique, a portion of the ground electrode 202 to shield the inductor element 203 is not present. This causes a risk that when the high frequency module 200 is mounted on a mother board, for example, signals leaked from other elements, modules, and so on formed on the mother board interfere with the inductor element 203 so that the frequency characteristics and the like of the high frequency module 200 are deteriorated.

Further, in order to provide the cutout 204 in the ground electrode 202 at a portion thereof corresponding to the inductor element 203, the ground electrode 202 is removed considerably, causing the area of the ground electrode 202 to be smaller. As a result, inductance that is parasitically present on wiring for connecting electronic components mounted on the wiring substrate 201 with the ground electrode 202 increases.

SUMMARY OF THE INVENTION

Preferred embodiments of the present invention provide a composite module that prevents signals leaked from external components such as a mother board and the like from interfering with inductors, capacitors, and the like provided inside a wiring substrate. In addition, preferred embodiments of the present invention provide a composite module that prevents interference by the leaked signals mentioned above by adjusting impedance of wiring electrodes configuring circuits that are provided inside the wiring substrate and significantly reduces or prevents stray capacitance produced between the wiring electrodes and ground electrodes.

A composite module according to a preferred embodiment of the present invention includes an outer ground electrode for external connection that is provided on one main surface of a wiring substrate, a wiring electrode inside the wiring substrate, and a first ground electrode on the same surface where the wiring electrode is provided or inside the wiring substrate between the wiring electrode and the outer ground electrode; and the wiring electrode overlaps with at least one of the first ground electrode and the outer ground electrode when viewed from above.

As described above, the wiring electrode is shielded by the outer ground electrode and the first ground electrode on the one main surface side of the wiring substrate. Accordingly, for example, in the case where the one main surface side of the wiring substrate is connected with a mother board, signals leaked from other elements, modules, and so on located on the mother board are prevented from interfering with the wiring electrode.

It is preferable that the first ground electrode be provided on a different surface from the surface where the wiring electrode is provided, and a first cutout be provided in the first ground electrode at least at a portion of a region overlapping with the wiring electrode and the outer ground electrode when viewed from above. In this case, because the first cutout overlaps with the outer ground electrode when viewed from above, the wiring electrode is shielded with certainty on the one main surface side of the wiring substrate. Further, providing the first cutout makes it possible to reduce an area where an electrode section of the first ground electrode and the wiring electrode overlap with each other, so that stray capacitance produced between the two electrodes is significantly reduced or prevented. Furthermore, by adjusting an area of the first cutout when viewed from above, impedance of the wiring electrode is also adjusted.

Further, it is preferable for a second ground electrode to be included while being provided between the wiring electrode and the other main surface of the wiring substrate, and for a second cutout to be provided in the second ground electrode at least at a portion of a region overlapping with the wiring electrode when viewed from above. In this case, because impedance is adjusted by both the first cutout and the second cutout, the degree of freedom in impedance adjustment is made higher, and a range of the adjustment is widened.

It is preferable for the second cutout to be disposed so as not to overlap with the first cutout when viewed from above. In this case, for example, undesired leak signals that pass from the other main surface side of the wiring substrate through the second cutout are blocked by the first ground electrode, thus making it possible to prevent the shielding effect from being decreased due to providing the second cutout.

Of an area of the first cutout and an area of the second cutout, it is preferable for the area of one cutout provided in one ground electrode which is closer to the wiring electrode on the first ground electrode and the second ground electrode to be made larger when viewed from above than the area of the other cutout provided the other ground electrode which is farther away from the wiring electrode.

By doing so, stray capacitance is prevented from being produced, in other words, the stray capacitance is prevented from being produced more efficiently in comparison with a case in which the area of one cutout provided at a side closer to the wiring electrode is made larger than the area of the other cutout, when viewed from above.

It is preferable for the first ground electrode to be provided on the same surface where the wiring electrode is provided, for a third cutout to be provided in the first ground electrode at least at a portion of a region overlapping with the outer ground electrode when viewed from above, and for the wiring electrode to be provided in the third cutout. In this case, the wiring electrode and the first ground electrode are provided on the same surface, which makes it possible to dispose the electrodes on the wiring substrate at high density so as to miniaturize the composite module. In addition, because the wiring electrode is preferably provided in the third cutout overlapping with the outer ground electrode when viewed from above, the wiring electrode is shielded with certainty on the one main surface side of the wiring substrate.

According to various preferred embodiments of the present invention, the wiring electrode inside the wiring substrate overlaps with at least one of the first ground electrode and the outer ground electrode when viewed from above, and the first cutout is provided in the first ground electrode at least at a portion of a region overlapping with the wiring electrode and the outer ground electrode when viewed from above, such that stray capacitance produced between the wiring electrode and the first ground electrode is significantly reduced or prevented and impedance of the wiring electrode is adjusted by the first cutout while the wiring electrode is shielded with certainty on the one main surface side of the wiring substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
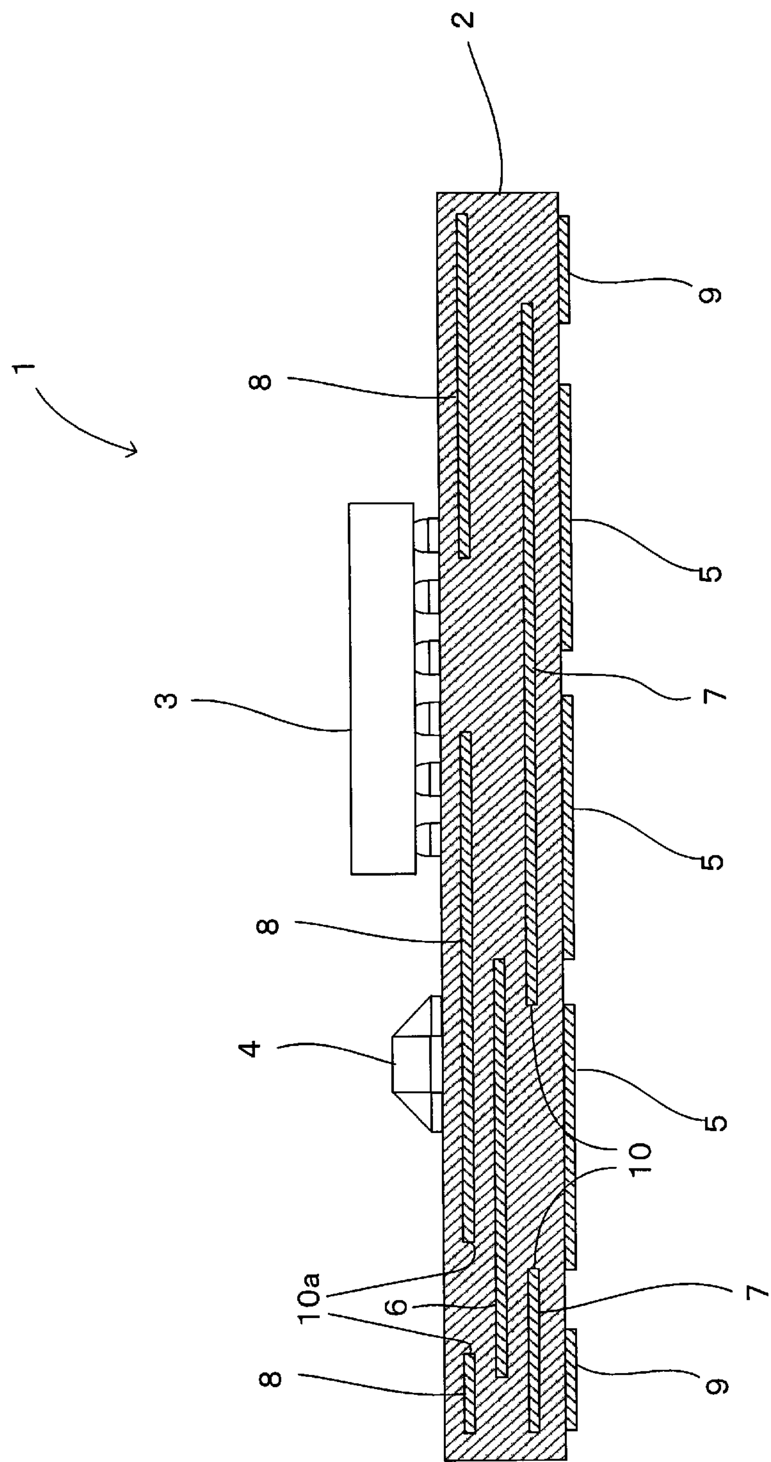
FIG. 1 is a cross-sectional view of a composite module according to a first preferred embodiment of the present invention.

Composite modules according to preferred embodiments of the present invention will be described hereinafter with reference to FIGS. 1 through 3. FIG. 1 is a cross-sectional view of a composite module according to a first preferred embodiment of the present invention. FIGS. 2A-2D and FIG. 3 show internal structure views of a wiring substrate shown in FIG. 1, in which plan views of respective layers where a wiring electrode, a first ground electrode, a second ground electrode, outer ground electrodes, and so on are provided are illustrated.

A composite module 1 according to the present preferred embodiment preferably is a multiband switch module that is mounted in a cellular phone or the like and configured to transmit/receive signals in a plurality of frequency bands and that includes, as shown in FIG. 1, a wiring substrate 2 on the front and rear surfaces and at the inside of which electrodes, via conductors for interlayer connection, and the like are provided, a switch IC 3 mounted on the front surface of the wiring substrate 2, and a chip component 4 configuring a capacitor, an inductor, and the like of an impedance matching circuit or the like that is provided in the wiring substrate 2; the multiband switch module is configured such that the switch IC 3 performs connection-switching on the signals in a plurality of frequency bands received through a common antenna so as to supply the signals to signal paths corresponding to each frequency band, supplies the transmission signals inputted from a mother board to the common antenna signal by signal corresponding to each frequency band, and so on.

The wiring substrate 2 preferably is a glass epoxy resin multilayer substrate, a low temperature co-fired ceramic (LTCC) multilayer substrate, or the like. For example, in the case where the wiring substrate 2 is an LTCC multilayer substrate, a slurry, in which mixed powder of alumina, glass, and the like is mixed with an organic binder, a solvent, and the like together, defines ceramic green sheets in the form of sheets, via holes are formed in the green sheets at predetermined positions by laser processing or the like, a conductive paste containing Ag, Cu, or the like fills the via holes having been formed so as to form via conductors for interlayer connection, and then various types of electrode patterns are formed by printing with a conductive paste. Thereafter, the ceramic green sheets preferably are laminated and press-bonded together to form a ceramic multilayer body; the ceramic multilayer body undergoes firing at a low temperature of approximately 1,000° C., in other words, is manufactured by what is called low-temperature firing.

On one main surface and at the inside of the wiring substrate 2, as shown in FIG. 1, there are provided outer ground electrodes 5 for external connection, a wiring electrode 6 that defines an inductor element, a first ground electrode 7 that is provided between the outer ground electrode 5 and the wiring electrode 6, a second ground electrode 8 that is provided between the wiring electrode 6 and the other main surface of the wiring substrate 2, a wiring pattern 11 that is provided in the wiring substrate for use as a signal transmission path, and so on.

Figure 2A:
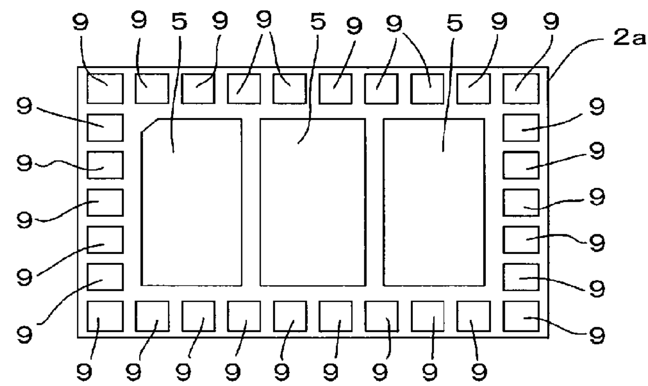
FIGS. 2A-2D are internal structure views illustrating a wiring substrate shown in FIG. 1.
Figure 3:
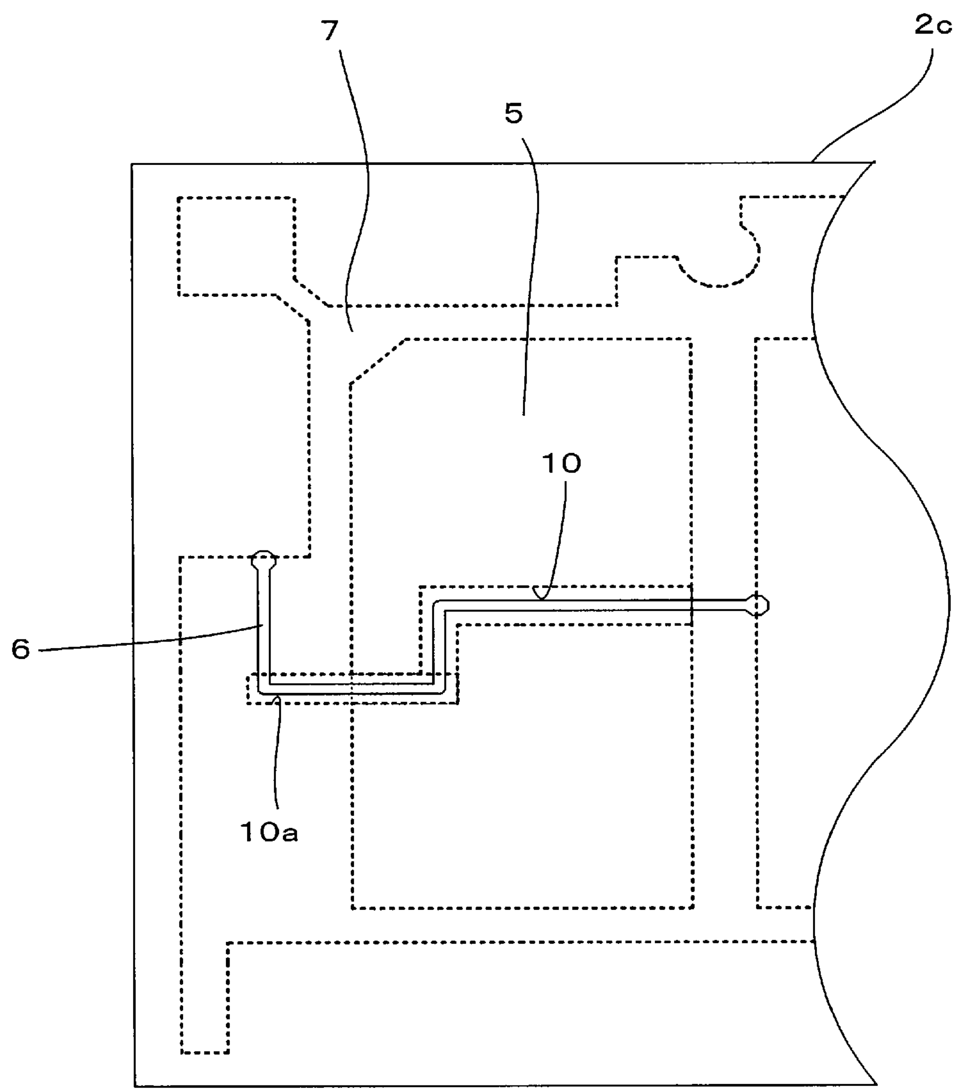
FIG. 3 is an internal structure view of a wiring substrate shown in FIG. 1.

In this case, of layers of the wiring substrate 2, a layer 2*a* which is positioned to define the lowest layer has, as shown in FIG. 2A, on a rear surface thereof (the one main surface of the wiring substrate 2), a plurality of mounting electrodes 9 located at a circumferential edge of the rear surface for input/output of signals between the mother board and the composite module 1 as well as outer ground electrodes 5 for external connection which are provided in three locations within a region surrounded by the mounting electrodes 9 and connected with ground electrodes of the mother board. As examples of the mounting electrodes 9, an electrode for input/output of an RF signal, an electrode for a control signal to be inputted to the switch IC 3, an electrode configured to supply power to the switch IC 3, an electrode for connection with an external antenna, and so on can be cited.

Figure 2B:
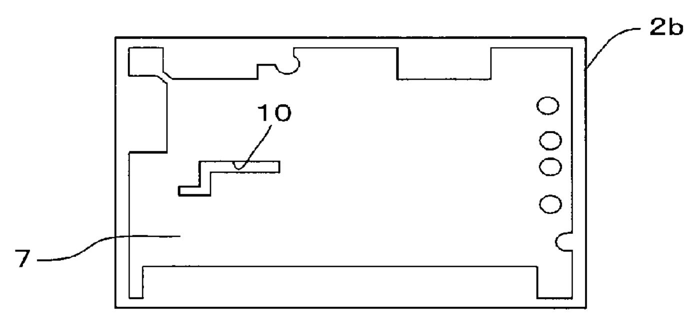

On a layer 2*b* which is positioned above the lowest layer 2*a*, as shown in FIG. 2B, the first ground electrode 7 to be grounded is provided, and a first cutout 10 is provided in the first ground electrode 7 so as to reduce stray capacitance produced between the wiring electrode 6 configuring an inductor element and the first ground electrode 7 and to adjust impedance of the wiring electrode 6. Note that the first cutout 10 is a portion where the first ground electrode 7 is not provided and a material of the layer 2*b* is exposed.

Figure 2C:
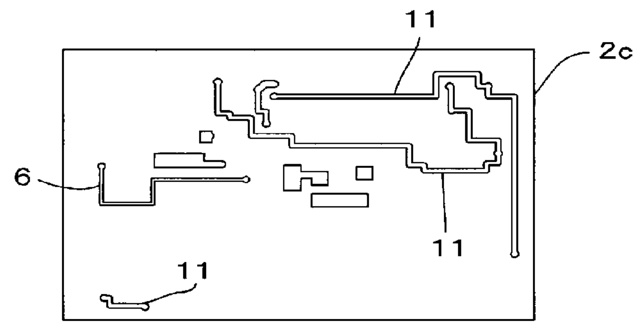

Further, on a layer 2*c* which is positioned above the layer 2*b*, as shown in FIG. 2C, there are provided the wiring electrode 6 configuring the inductor element that constitutes a portion of a circuit of the composite module 1, the wiring pattern 11 for use as a signal transmission path, and so on.

Figure 2D:
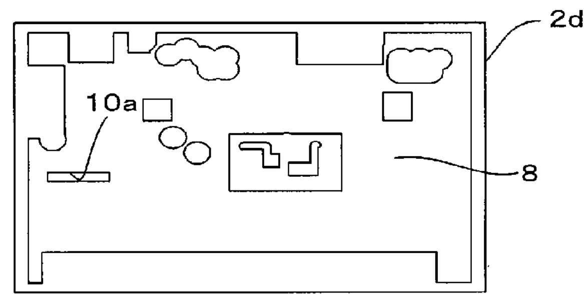

Furthermore, on a layer 2*d* which is positioned above the layer 2*c*, as shown in FIG. 2D, the second ground electrode 8 to be grounded is provided, and a second cutout 10*a* is provided in the second ground electrode 8 so as to reduce stray capacitance produced between the wiring electrode 6 and the second ground electrode 8 and to adjust impedance of the wiring electrode 6. Like the first cutout 10, the second cutout 10*a* is a portion where a material of the layer 2*d* is exposed. The outer ground electrodes 5, the first ground electrode 7, and the second ground electrode 8 are connected with one another through via conductors (not illustrated) provided in each of the layers of the wiring substrate 2.

On the other main surface of the wiring substrate 2 (not illustrated), mounting electrodes to be connected with the switch IC 3 and the chip component 4, and the like are provided; the switch IC 3 and the chip component 4 are mounted on the other main surface of the wiring substrate 2 by connecting the mounting electrodes to the switch IC 3 and the chip component 4 through soldering.

Next, an arrangement relationship among the wiring electrode 6, the outer ground electrodes 5, the first cutout 10 of the first ground electrode, and the second cutout 10*a* of the second ground electrode 8 will be described with reference to FIG. 3. FIG. 3 is a layout drawing of the electrodes when viewed from above in which the layers 2*a*, 2*b*, and 2*d* respectively illustrated in FIGS. 2A, 2B and 2D are superposed together, where the layer 2*c* in FIG. 2C is set as the base of the drawing; note that FIG. 3 illustrates a portion of the layers (left side of the layers in FIGS. 2A-2D. The wiring electrode 6 provided on the layer 2*c* is indicated by a solid line, and the electrodes, the cutouts, and the like provided on the other layers 2*a*, 2*b*, and 2*d* are indicated by broken lines. Further, only the outer ground electrode 5, the first ground electrode 7, the first cutout 10 provided in the first ground electrode 7, and the second cutout 10*a* provided in the second ground electrode 8 are illustrated, and the other constituent elements are omitted in the drawing.

As shown in FIG. 3, the wiring electrode 6 overlaps with at least one of the outer ground electrode 5 and the first ground electrode 7 when viewed from above. The first cutout 10 is located in a region overlapping with the wiring electrode 6 and the outer ground electrode 5 when viewed from above in the first ground electrode 7. It is sufficient that the first cutout 10 is provided in the first ground electrode 7 at least at a portion of a region overlapping with the wiring electrode 6 and the outer ground electrode 5 when viewed from above. In this case, by adjusting an area of a region where the first cutout 10 overlaps with the wiring electrode 6 when viewed from above, stray capacitance produced between the wiring electrode 6 and the first ground electrode 7 is adjusted, which makes it possible for the cutout 10 to be used in adjusting impedance of the wiring electrode 6.

As shown in FIG. 3, the second cutout 10*a* is provided at a portion of a region overlapping with the wiring electrode 6 when viewed from above in the second ground electrode 8. In this case, the first cutout 10 and the second cutout 10*a* are disposed so that portions thereof overlap with each other when viewed from above. Note that, however, the cutouts may be configured such that the second cutout 10*a* is disposed so as not to overlap with the first cutout 10 when viewed from above. By disposing the second cutout 10*a* so as not to overlap with the first cutout 10 when viewed from above, undesired leak signals that pass from the other main surface side of the wiring substrate 2 through the second cutout 10*a* are blocked by the first ground electrode 7, thus making it possible to significantly reduce or prevent the shielding effect from being decreased due to providing the second cutout 10*a*.

In the case where it is necessary to significantly reduce or prevent the stray capacitance produced between the wiring electrode 6 and the first and second ground electrodes 7 and 8 while ensuring the shielding of the wiring electrode 6, it is sufficient to make, of an area of the first cutout 10 and an area of the second cutout 10*a*, the area of one cutout (a portion where the cutouts 10 and 10*a* each overlap with the wiring electrode 6 when viewed from above) provided in one ground electrode which is closer to the wiring electrode 6 in the first ground electrode 7 and the second ground electrode 8 be larger when viewed from above than the area of the other cutout provided on the other ground electrode which is farther away from the wiring electrode 6. By making the area of the cutout provided at a side closer to the wiring electrode 6 be larger when viewed from above as described above, stray capacitance is significantly reduced or prevented from being produced, in other words, the stray capacitance is prevented from being produced more efficiently in comparison with a case in which the area of one cutout provided at a side farther away from the wiring electrode is made larger when viewed from above than the area of the other cutout.

As such, according to the above-described preferred embodiment, because the wiring electrode 6 is shielded by the outer ground electrodes 5 and the first ground electrode 7 on the one main surface side of the wiring substrate 2, signals leaked from other elements, modules, and so on located on a mother board are prevented from interfering with the wiring electrode 6 when the one main surface side of the wiring substrate 2 is connected with the mother board, for example. This makes it possible to prevent high frequency characteristics of the composite module 1 from being deteriorated.

Further, with the first cutout 10 provided in the first ground electrode 7, an area where an electrode section of the first ground electrode 7 and the wiring electrode 6 overlap with each other is reduced when viewed from above, such that stray capacitance produced between the two electrode 6 and 7 is significantly reduced or prevented. Furthermore, because the first cutout 10 overlaps with the outer ground electrode 5 when viewed from above, undesired signals leaked from the mother board side do not interfere with the wiring electrode 6, such that high frequency characteristics of the composite module 1 are prevented from being deteriorated due to the first cutout 10 being provided in the first ground electrode 7.

Since the second cutout 10*a* is provided at a portion of a region overlapping with the wiring electrode 6 when viewed from above in the second ground electrode 8, impedance of the wiring electrode 6 is also adjusted with the second cutout 10*a* by adjusting an area of the second cutout 10*a* when viewed from above. This increases the degree of freedom in impedance adjustment of the wiring electrode 6 and widen a range of the adjustment.

Further, because the cutouts 10 and 10*a* are respectively provided only in a region where the first and second ground electrodes 7, 8 and the wiring electrode 6 overlap with each other when viewed from above, the areas of the cutouts 10 and 10*a* are respectively reduced when viewed from above in comparison with a case of a conventional configuration in which a cutout having a larger area when viewed from above is provided at a portion corresponding to an inductor element. This allows the areas of the electrode formation sections of the ground electrodes 7 and 8 to be larger when viewed from above compared to the case of the conventional configuration, thus making it possible to prevent the increase in inductance that is parasitically present on the wiring which connects the switch IC 3, the chip component 4, and so on mounted on the wiring substrate 2 to the ground electrodes 7 and 8.

Furthermore, by changing the thicknesses of the layers 2*b* and 2*d* where the cutouts 10 and 10*a* are provided, respectively, and the thickness of the layer 2*c* where the wiring electrode 6 is provided, distances between the wiring electrode 6 and the first and second ground electrodes 7 and 8 are changed, such that the range of impedance adjustment is further widened.

Second Preferred Embodiment

Figure 4A:
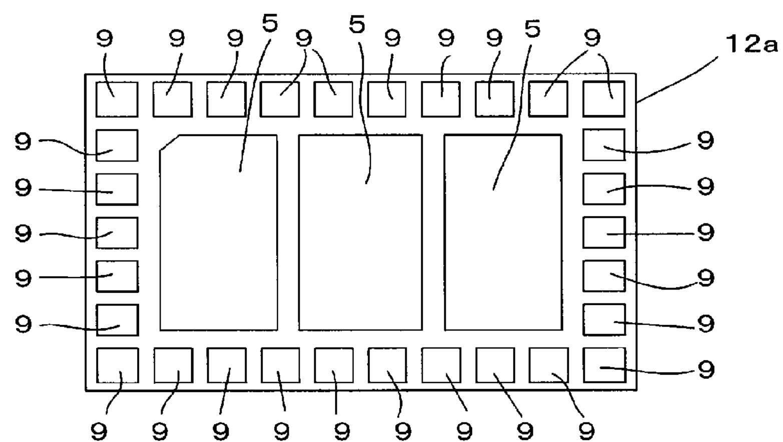
FIGS. 4A-4C are internal structure views illustrating a wiring substrate in a composite module according to a second preferred embodiment of the present invention.
Figure 4B:
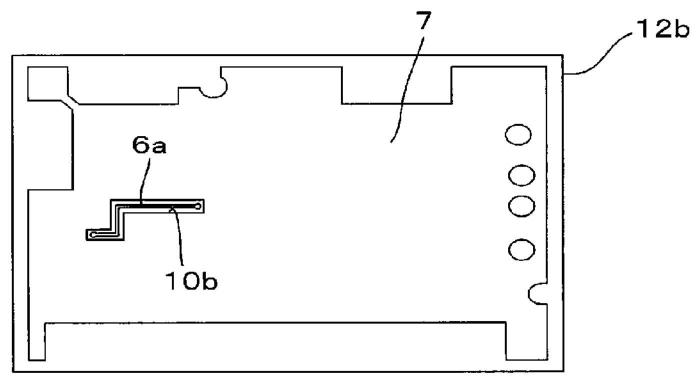
Figure 4C:
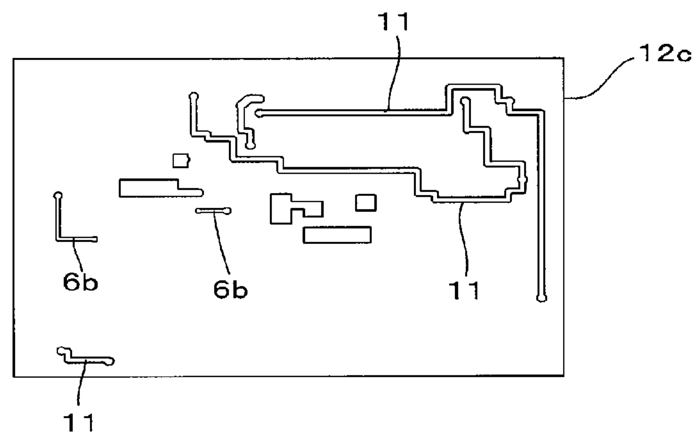
Figure 5:
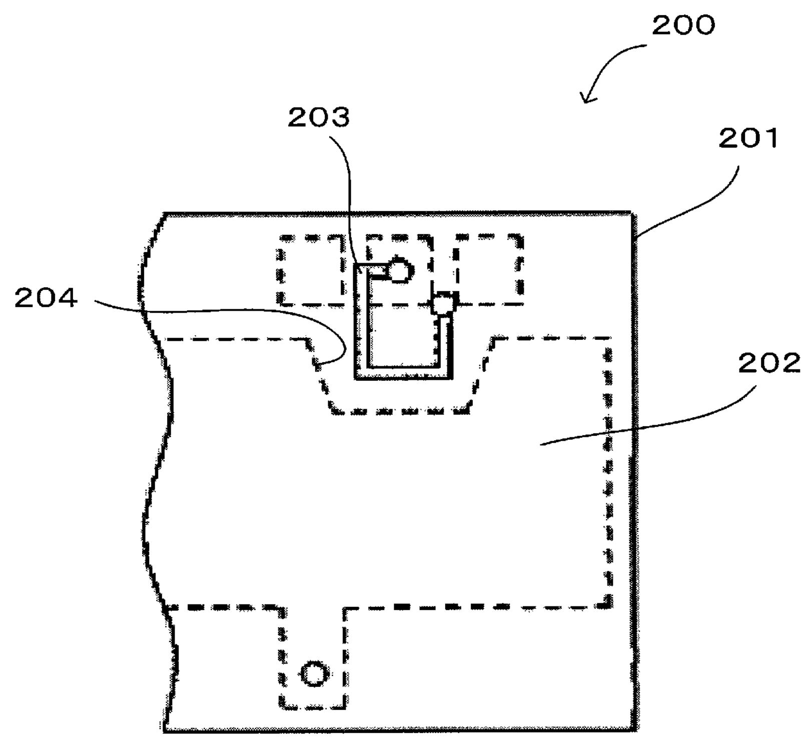
FIG. 5 is an internal structure view of a wiring substrate in a known composite module.

A composite module 1*a* according to a second preferred embodiment of the present invention will be described with reference to FIGS. 4A-4C. FIGS. 4A-4C include internal structure views showing a wiring substrate 12 in the composite module 1*a*, in which plan views of respective layers where the outer ground electrodes 5 of the wiring substrate 12, the first ground electrode 7, the wiring electrode 6, and so on are provided are illustrated.

The composite module 1*a* according to the present preferred embodiment differs from the composite module 1 of the first preferred embodiment having been discussed referring to FIGS. 1 and 2 in a point that the first ground electrode 7 and a portion 6*a* of the wiring electrode 6 both provided inside the wiring substrate 12 of the composite module 1*a* are provided on the same surface (a layer 12*b* being shared) while a remaining portion 6*b* of the wiring electrode 6 is provided on another layer 12*c* which is different from the layer 12*b* where the first ground electrode 7 and the portion 6*a* of the wiring electrode 6 are provided, as shown in FIGS. 4B and 4C. Since the other constituent elements are preferably the same as those in the composite module 1 of the first preferred embodiment, the same reference signs are given to them and descriptions thereof are omitted herein.

In this case, of layers in the wiring substrate 12, a layer 12*a* which defines the lowest layer (one main surface of the wiring substrate 12) has, as shown in FIG. 4A, the plurality of mounting electrodes 9 located at a circumferential edge thereof for input/output of signals between the mother board and the composite module 1*a* as well as the outer ground electrodes 5 for external connection which are provided in three locations within a region surrounded by the mounting electrodes 9 and connected with ground electrodes of the mother board, just like the layer 2*a* of the wiring substrate 2 discussed in the first preferred embodiment.

On the layer 12*b* which is positioned above the lowest layer 12*a*, as shown in FIG. 4B, the first ground electrode 7 to be grounded is provided, and a third cutout 10*b* is provided in the first ground electrode 7 at a portion of a region overlapping with the outer ground electrode 5 when viewed from above. Then, the portion 6*a* of the wiring electrode 6 configuring an inductor element is provided in the third cutout 10*b*.

Further, on the layer 12*c* which is positioned above the layer 12*b*, as shown in FIG. 4C, the remaining portion 6*b* of the wiring electrode 6 and the wiring pattern 11 for use as a signal transmission path are provided. In this case, the remaining portion 6*b* of the wiring electrode 6 is provided at a position overlapping with the first ground electrode 7 when viewed from above.

The present preferred embodiment may have a configuration such that the second ground electrode 8 is provided on a layer positioned above the layer 12*c*, like the layer 2*d* of the wiring substrate 2 in the first preferred embodiment as shown in FIG. 2D. In this case, a cutout may be provided in the second ground electrode 8 at a portion of a region overlapping with the wiring electrode 6 when viewed from above in order for the cutout to adjust impedance of the wiring electrode 6 and so on.

As such, according to the above-described second preferred embodiment, locating the first ground electrode 7 and the wiring electrode 6*a* on the same surface (layer 12*b*) makes it possible to increase the density of the electrodes provided on the wiring substrate 12, such that the composite module 1*a* is miniaturized. In addition, because the wiring electrode 6 overlaps with at least one of the outer ground electrode 5 and the first ground electrode 7 when viewed from above, the wiring electrode 6 is shielded with certainty on the one main surface side of the wiring substrate 12.

It is to be noted that the present invention is not intended to be limited to the above-described preferred embodiments, and various kinds of modifications can be made thereupon without departing from the essential spirit of the present invention.

For example, in the above preferred embodiments, although the first and second cutouts 10 and 10*a* preferably are respectively provided in a region where the wiring electrode 6 configuring an inductor element and the ground electrodes 7 and 8 overlap with each other when viewed from above in the ground electrodes 7 and 8, a target for which the first and second cutouts 10 and 10*a* are provided is not intended to be limited to the wiring electrode 6 configuring the inductor element; the first and second cutouts 10 and 10*b* can be provided for various kinds of wiring at the inside of the wiring substrates 2 and 12. In this case, in the ground electrodes 7 and 8, the first and second cutouts 10 and 10*a* may be respectively provided in a region where a target wiring and the ground electrodes 7 and 8 overlap with each other when viewed from above, and the first and second cutouts 10 and 10*a* may be used to adjust impedance of the target wiring, reduce stray capacitance produced between the target wiring and the ground electrode 7 and 8, and so on.

Further, the ground electrodes at the inside of the wiring electrodes 2 and 12 are not intended to be limited to the first and second ground electrodes 7 and 8, and may be configured such that they are located on other layers. Also in this case, cutouts may be provided in those ground electrodes in the same manner as described above, and the cutouts may be used for the adjustment in impedance and the reduction in stray capacitance.

Preferred embodiments of the present invention can be applied in a variety of composite modules including wiring substrates including wiring electrodes inside and on the main surfaces thereof.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite module comprising: a wiring substrate; an outer ground electrode located on one main surface of the wiring substrate; a wiring electrode located inside the wiring substrate; a first ground electrode located on a same different surface than where the wiring electrode is provided, the different surface being allocated inside the wiring substrate between the wiring electrode and the outer ground electrode; and a first cutout provided in the first ground electrode at least at a portion of a region of the first ground electrode overlapping with the wiring electrode and the outer ground electrode when viewed from above; wherein the wiring electrode overlaps with at least one of the first ground electrode and the outer ground electrode when viewed from above; further comprising; a second ground electrode between the wiring electrode and another main surface of the wiring substrate; wherein a second cutout is provided in the second ground electrode at least at a portion of a region of the second ground electrode overlapping with the wiring electrode when viewed from above, wherein the second cutout is disposed so as not to overlap with the first cutout when viewed from above.

2. The composite module according to claim 1, wherein an area of one of the first and second cutouts provided in a respective one of the first and second ground electrodes which is closer to the wiring electrode is larger when viewed from above than an area of the other one of the first and second cutouts provided in the other one of the first and second ground electrodes which is farther away from the wiring electrode.

3. The composite module according to claim 1, wherein a third cutout is provided in the first ground electrode at least at a portion of a region of the first ground electrode overlapping with the outer ground electrode when viewed from above; and the wiring electrode is provided in the third cutout.

4. The composite module according to claim 1, wherein the composite module is a multiband switch module.

5. The composite module according to claim 1, further comprising a switch IC mounted on the wiring substrate.

6. The composite module according to claim 1, further comprising an impedance matching circuit provided in the wiring substrate.

7. The composite module according to claim 1, further comprising a plurality of mounting electrodes located at a circumferential edge of a surface of the wiring substrate.

8. The composite module according to claim 1, wherein the first ground electrode and a first portion of the wiring electrode both provided inside the wiring substrate are provided on a same surface and a second portion of the wiring electrode is provided on another layer which is different from the layer on which the first ground electrode and the first portion of the wiring electrode are provided.

9. The composite module according to claim 8, wherein a third cutout is provided in the first ground electrode at least at a portion of a region overlapping with the outer ground electrode when viewed from above and the wiring electrode is provided in the third cutout.

10. The composite module according to claim 8, wherein the second portion overlaps the first ground electrode when viewed from above.

11. The composite module according to claim 1, wherein the wiring electrode defines an inductor.

12. A cellular phone comprising the composite module according to claim 1.

13. The cellular phone according to claim 12, wherein the composite module is a multiband switch module.

* * * * *